(12) United States Patent
Veinger et al.

(10) Patent No.: US 9,231,020 B2
(45) Date of Patent: Jan. 5, 2016

(54) DEVICE AND METHOD OF GETTERING ON SILICON ON INSULATOR (SOI) SUBSTRATE

(71) Applicants: Dmitry Veinger, Zikhron Ya'akov (IL); Assaf Lahav, Binyamina (IL); Omer Katz, Nofit (IL); Ruthie Shima-Edelstein, Haifa (IL)

(72) Inventors: Dmitry Veinger, Zikhron Ya'akov (IL); Assaf Lahav, Binyamina (IL); Omer Katz, Nofit (IL); Ruthie Shima-Edelstein, Haifa (IL)

(73) Assignee: TOWER SEMICONDUCTOR LTD., Migdal Haemek (IL)

( * ) Notice: Subject to any disclaimer, the term of this patent is extended or adjusted under 35 U.S.C. 154(b) by 0 days.

(21) Appl. No.: 14/156,620

(22) Filed: Jan. 16, 2014

(65) Prior Publication Data

US 2015/0200227 A1 Jul. 16, 2015

(51) Int. Cl.
*H01L 27/146* (2006.01)
*H01L 27/148* (2006.01)

(52) U.S. Cl.
CPC .... *H01L 27/14698* (2013.01); *H01L 27/14812* (2013.01)

(58) Field of Classification Search
CPC .............. H01L 31/02; H01L 27/14698; H01L 27/14812
USPC ........................... 257/228, 239, 225, 231, 233
See application file for complete search history.

(56) References Cited

U.S. PATENT DOCUMENTS

| 5,753,560 | A | 5/1998 | Hong et al. |
|---|---|---|---|
| 6,093,624 | A | 7/2000 | Letavic et al. |
| 6,479,875 | B1 | 11/2002 | Gonzalez |
| 7,180,153 | B2 | 2/2007 | Kamino et al. |
| 7,459,735 | B2 | 12/2008 | Ezaki et al. |
| 2006/0194409 | A1 | 8/2006 | Capedelli et al. |
| 2008/0042170 | A1* | 2/2008 | Han ................... H01L 27/14689 257/229 |
| 2010/0214457 | A1* | 8/2010 | Sakai ................ H01L 27/14698 348/294 |
| 2014/0077271 | A1* | 3/2014 | Fujii ............................. 257/239 |
| 2014/0191289 | A1* | 7/2014 | Wang ................ H01L 27/14831 257/231 |
| 2014/0231879 | A1* | 8/2014 | Meynants ......... H01L 27/14616 257/230 |

OTHER PUBLICATIONS

Bedabrata Pain, 2009 IISW Symposium on Backside Illumination of Solid-State Image Sensors, Backside Illumination Technology for SOI-CMOS Image Sensors, Jun. 25, 2009, Bergen, Norway, 23 pages.

* cited by examiner

*Primary Examiner* — Mark Tornow
(74) *Attorney, Agent, or Firm* — Shichrur & Co.

(57) ABSTRACT

Some demonstrative embodiments include devices and/or methods of gettering on silicon on insulator (SOI) substrate. For example, a complementary metal-oxide-semiconductor (CMOS) integrated circuit (IC) may include a plurality of pixels arranged on a wafer, a pixel of the pixels including: a silicon active area; at least one non-silicided leakage-sensitive component formed on the active area, the leakage-sensitive component is sensitive to metal contaminants; a non-leakage-sensitive area formed on the active area, the non-leakage-sensitive area surrounding the leakage-sensitive component; and at least one silicided gettering region formed on the non-leakage-sensitive area to trap the metal contaminants.

14 Claims, 6 Drawing Sheets

DEVICE AND METHOD OF GETTERING ON SILICON ON INSULATOR (SOI) SUBSTRATE

TECHNICAL FIELD

Embodiments described herein generally relate to gettering on silicon on insulator (SOI) substrate.

BACKGROUND

A complementary metal-oxide-semiconductor (CMOS) image sensor may suffer contamination of metal impurities.

The metal impurities may result from the manufacturing process of the CMOS image sensor.

The metal impurities may remain in proximity to active areas of the CMOS image sensor and may reduce a performance of the CMOS image sensor. For example, the metal impurities may defect one or more pixels of the CMOS image sensor, e.g., by causing a leakage in a reversed biased diode of the pixel, which may result in Dark Currents and a "Bright Pixel" effect.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
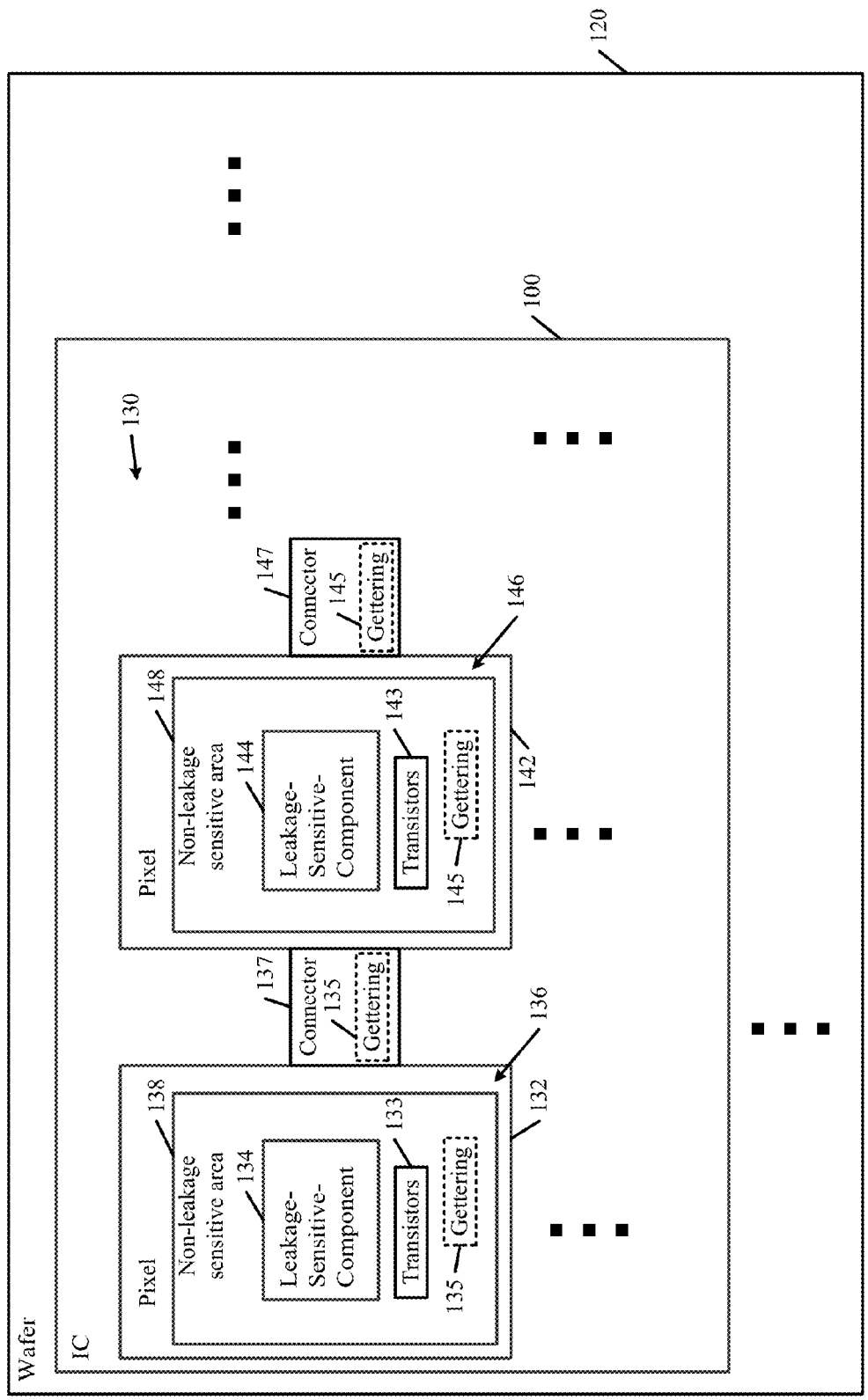
FIG. 1 is a schematic block diagram illustration of an integrated chip (IC), in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with various devices and systems, for example, an imaging device, a digital camera device, a video device, a camera module, a medical imaging device, a mobile computer, a laptop computer, a notebook computer, a tablet computer, a handheld computer, a handheld device, a Personal Digital Assistant (PDA) device, a handheld PDA device, a mobile or portable device, a consumer device, a Smartphone and the like.

The terms "substrate" and/or "wafer", as used herein, may relate to a thin slice of semiconductor material, for example, a silicon crystal, which may be used in fabrication of integrated circuits and/or any other microelectronic devices. For example, the wafer may serve as the substrate for the microelectronic devices, which may be built in and over the wafer.

The term "Silicon On Insulator" (SOI), as used herein, may relate to a layered substrate having a silicon layer, an insulator layer, and a silicon layer. For example, the insulator layer may include a silicone oxide layer, or any other layer.

The term "Integrated Circuit" (IC), as used herein, may relate to a set of one or more electronic circuits on a semiconductor material. For example, the electronic circuit may include electronic components and their interconnectors.

The term "silicide", as used herein, may relate to a chemical compound of silicon with one or more relatively more electropositive elements, e.g., metal or any other element.

The term "gettering", as used herein, may relate to moving, partially or completely, metal impurities from one or more active areas of a substrate to non-active areas of the substrate, and trapping the metal impurities in the non-active areas.

The terms "connected" and/or "connecting", as used herein, may relate to a direct connection between two components.

The term "active area", as used herein, may relate to an area on top of a substrate on which one or more electronic components are integrated. For example, the active area may include one or more integrated electronic components and their interconnectors.

Reference is made to FIG. 1, which schematically illustrates a block diagram of an integrated circuit (IC) 100, in accordance with some demonstrative embodiments.

In some demonstrative embodiments, IC 100 may include a complementary metal-oxide-semiconductor (CMOS) IC formed on a wafer 120.

In some demonstrative embodiments, a plurality of ICs 100 may be formed on wafer 120, e.g., in addition to IC 100.

In some demonstrative embodiments, IC 100 may include and/or may be part of an image-sensing device. For example, IC 100 may be part of a digital camera, a medical imaging device, and the like.

In some demonstrative embodiments, IC 100 may include an image sensor. For example, IC 100 may be configured to capture photons corresponding to an image and to convert the photons into electronic signals, for example, to enable processing the image and/or displaying of the image on a display.

In some demonstrative embodiments, IC 100 may include a Back-Side illuminated CMOS image sensor (BSI CIS).

In some demonstrative embodiments, the BSI CIS may have increased advantages over front side illuminated image sensors. For example, the BSI CIS may enable capturing an increased number of photons from the image, for example, compared to the front side illuminated image sensors.

In one example, the BSI CIS may enable capturing the increased number of photons, for example, since metal interconnectors of the BSI CIS may not cast a shadow on light sensitive areas of IC 100.

In some demonstrative embodiments, IC 100 may include and/or may be part of any other device. For example, IC 100 may be part of a memory device.

In some demonstrative embodiments, wafer 120 may include a silicon on insulator (SOI) wafer.

In some demonstrative embodiments, the SOI wafer may enable producing a relatively uniform and precise thickness of silicon layers, for example, for the BSI-CIS.

In some demonstrative embodiments, IC 100 may include a plurality of pixels 130.

In some demonstrative embodiments, the plurality of pixels 130 may be arranged in a two dimensional array of pixels. In other embodiments, the plurality of pixels 130 may be arranged in any other arrangement.

In some demonstrative embodiments, the plurality of pixels 130 may include a pixel 132 and a pixel 142, e.g., adjacent to pixel 132.

In some demonstrative embodiments, pixel 132 and/or pixel 142 may include a silicon active area, for example, including one or more electrical components of IC 100.

For example, pixel 132 may include an active area 136, and/or pixel 142 may include an active area 146.

In some demonstrative embodiments, pixel 132 and/or pixel 142 may include at least one non-silicided leakage-sensitive component formed on the active area. For example, pixel 132 may include a leakage-sensitive component 134 formed on active area 136, and/or pixel 142 may include a leakage-sensitive component 144 formed on active area 146.

In some demonstrative embodiments, a leakage-sensitive component may include any component in which charge carriers, e.g., electrons, tunnel from the leakage-sensitive component through an insulating region, for example, as a result of a conductive material in a proximity to the leakage-sensitive component.

In some demonstrative embodiments, leakage-sensitive components 134 and/or 144 may include a charge collecting component and/or a storage area. For example, leakage-sensitive components 134 and/or 144 may be formed of n-type doped silicon.

In some demonstrative embodiments, leakage-sensitive components 134 and/or 144 may include a reverse biased p/n junction diode.

In one example, leakage-sensitive components 134 and/or 144 may include a photo diode, for example, if IC 100 is implemented as part of an image-sensing device.

For example, the photo diode may convert photos from an image into voltage signals, for example, to enable processing of the image.

In another example, leakage-sensitive components 134 and/or 144 may include a memory node diode, for example, if IC 100 is implemented as part of a memory device.

In some demonstrative embodiments, pixel 132 and/or pixel 142 may include a non-leakage-sensitive area formed on the active area and surrounding the non-silicided leakage-sensitive component. For example, the non-leakage-sensitive area may include an isolation area configured to electrically isolate the leakage-sensitive component.

In some demonstrative embodiments, a non-leakage-sensitive component may include any component in which charge carriers, e.g., electrons, may not tunnel from the non-leakage-sensitive component through an insulating region, for example, as a result of a conductive material in a proximity to the non-leakage-sensitive component.

For example, pixel 132 may include a non-leakage-sensitive area 138 surrounding leakage-sensitive component 134 formed on active area 136, and/or pixel 142 may include a non-leakage-sensitive area 148 surrounding leakage-sensitive component 144 formed on active area 146.

In some demonstrative embodiments, non-leakage-sensitive areas 138 and/or 148 may be formed of p-type doped silicon.

In some demonstrative embodiments, non-leakage-sensitive areas 138 and/or 148 may include a transistor area including one or more transistors configured to perform one or more functionalities of IC 100.

For example, non-leakage-sensitive areas 138 may include transistors 133 and/or non-leakage-sensitive areas 148 may include transistors 143.

In some demonstrative embodiments, transistors 133 and/or 143 may include one or more sources and/or drains of transistors, which may be non-leakage-sensitive. For example, the sources and/or the drains of the transistors may be formed of relatively highly doped silicon, e.g., highly doped n-type silicon, which is non-leakage-sensitive.

In some demonstrative embodiments, IC 100 may be subject to one or more metal contaminants, for example, during a manufacturing process of the BSI CIS on wafer 120.

In some demonstrative embodiments, the metal contaminants may include any metal material, for example, copper, nickel, iron, chromium, and/or the like.

In some demonstrative embodiments, leakage-sensitive components 134 and/or 144 may be sensitive to the metal contaminants. For example, the metal contaminants may cause defects to pixels 132 and/or 142, e.g., resulting in a "bright pixel" effect.

The metal contaminants may remain trapped in proximity to leakage-sensitive components 134 and/or 144, and may reduce a performance of leakage-sensitive components 134 and/or 144. For example, the metal contaminants may cause reversed-biased diode leakage to leakage-sensitive components 134 and/or 144. The reversed-biased diode leakage may cause, for example, relatively high sensor Dark Currents from leakage-sensitive components 134 and/or 144.

In some demonstrative embodiments, collecting the metal contaminants from leakage-sensitive components 134 and/or 144 into gettering areas may decrease a number of defect pixels of the plurality of pixels 130.

In some demonstrative embodiments, a gettering process may include creating of the gettering areas and heating wafer 120 to trap the metal contaminants in the gettering areas.

In some demonstrative embodiments, creating the gettering areas on a back surface of wafer 120, e.g., opposite to active areas 136 and/or 146, may not be effective.

In one example, creating the gettering areas on the back surface of wafer 120 may be performed at the end of the manufacturing process of IC 100, for example, by creating damages and/or areas with defects ("the damages") on the back surface of wafer 120.

For example, the damages may perform the functionality of the gettering areas, to attract the metal contaminants from leakage-sensitive components 134 and/or 144 to the gettering areas, and to segregate the metal contaminants. However, the damages on the back surface of wafer 120 may not be able to attract the metal contaminants from leakage-sensitive components 134 and/or 144.

In one example, the damages on the back surface of wafer 120 may not be able to attract the metal contaminants, for example, if wafer 120 includes an SOI wafer, e.g., since the insulator layer, e.g., a buried oxide layer, may act as a burrier for a diffusion of the metal contaminants to the damages on the back of wafer 120.

In another example, the damages on the back surface of wafer 120 may not be able to attract the metal contaminants, for example, if wafer 120 has a relatively reduced thickness, for example, if IC 100 includes a BSI CIS. For example, the damages may have reduced dimensions, which may not be able to attract the metal contaminants, for example, if wafer 120 has the relatively reduced thickness.

Accordingly, extrinsic gettering techniques, which utilize the damages on the back surface of wafer 120, may not be suitable, for example, if wafer 120 includes an SOI wafer and/or if IC 100 includes a BSI-CIS.

In some demonstrative embodiments, gettering areas may be created on an active layer, e.g., a front or top surface, of wafer 120.

In some demonstrative embodiments, creating the gettering areas on the active layer of wafer 120 at a relatively large distance, e.g., at an array periphery, from leakage-sensitive components 134 and/or 144, may not enable effective gettering from leakage-sensitive components 134 and/or 144, for example, since a minimal distance is required to trap the metal contaminants.

In some demonstrative embodiments, having a trench isolation, e.g., a shallow trench isolation (STI), between the gettering areas may not enable a uniform gettering on the active layer. For example, trench isolation between pixel 132 and pixel 142 may not enable metal contaminants from pixel 132 to migrate to a gettering area in pixel 132 and vice versa.

Some demonstrative embodiments may enable distributing the gettering areas on the active layer of wafer 120 and within pixels 130. For example, the gettering areas may be distributed within active areas of pixels 130, for example, active areas 136 and/or 146, e.g., as described below.

Some demonstrative embodiments may enable uniform gettering on the active layer of IC 100, for example, without trench separation between the gettering areas, e.g., as described in detail below.

In some demonstrative embodiments, pixel 132 and/or pixel 142 may include at least one silicided gettering region formed on the non-leakage-sensitive area of pixels 132 and/or 142 to trap the metal contaminants.

For example, pixel 132 may include silicided gettering region 135 formed on non-leakage-sensitive area 138 to trap metal contaminants, and pixel 142 may include silicided gettering region 145 formed on non-leakage-sensitive area 138 to trap metal contaminants.

In some demonstrative embodiments, the gettering region may be at least at a distance, which may prevent leakage caused by the gettering region, from the leakage-sensitive component.

In some demonstrative embodiments, the gettering region may be at the distance of at least 0.3 micron from the leakage-sensitive component. For example, gettering region 135 may be at a distance of at least 0.3 micron (um) from leakage-sensitive component 134, and/or gettering region 145 may be at a distance of at least 0.3 um from leakage-sensitive component 144. In other embodiments, the gettering region may be at any other distance from the leakage-sensitive component.

In some demonstrative embodiments, a distance between the gettering region and the leakage-sensitive component may be configured to enable efficient gettering of the metal contaminants from the leakage-sensitive component.

In some demonstrative embodiments, the gettering region may be at a distance of no more than 100 um from the leakage-sensitive component. For example, gettering regions 135 may be at a distance of no more than 100 um from leakage-sensitive component 134, and/or gettering regions 145 may be at a distance of no more than 100 um from leakage-sensitive component 144. In other embodiments, the gettering region may be at any other distance from the leakage-sensitive component.

In some demonstrative embodiments, the distance between two gettering regions may be configured to enable uniform gettering on the active layer of IC 100 between all gettering regions of pixels 130.

In some demonstrative embodiments, the distance between two gettering regions may not be lesser than 100 um. For example, a distance between gettering regions 135 and 145 may not be lesser than 100 um. In other embodiments, two gettering regions may be separated by any other distance.

In some demonstrative embodiments, gettering regions 135 and/or 145 may be formed of Nickel, Cobalt and/or Titanium. In other embodiments, gettering regions 135 and/or 145 may be formed of any other material.

In some demonstrative embodiments, gettering regions 135 and/or 145 may have a thickness of at least 10 nanometer (nm) and no more than 100 nm. In other embodiments, gettering regions 135 and/or 145 may have any other thickness.

In some demonstrative embodiments, IC 100 may include at least one active area connector 137 connecting between active areas of pixels 130.

For example, IC 100 may include at least one active area connector 137 connecting between active area 136 and active area 146.

In some demonstrative embodiments, active area connector 137 may enable metal contaminants to migrate from pixel 142 to gettering region 135 of pixel 132, and metal contaminants from pixel 132 to migrate from pixel 132 to gettering region 145 of pixel 142.

In some demonstrative embodiments, active area connector 137 may enable uniform gettering of the metal contaminants between pixels 132 and 142, e.g., between gettering regions 135 and 145.

In some demonstrative embodiments, IC 100 may include a plurality of active area connectors connecting active areas of all of plurality of pixels 130 to form a continuous active area.

In some demonstrative embodiments, the continuous active area may enable uniform gettering of metal contaminants on IC 100. For example, the continuous active area may enable migration of metal contaminants from a pixel of pixels 130 to one or more adjacent pixels, e.g., four adjacent pixels, of pixels 130.

In some demonstrative embodiments, active area connector 137 may be formed of relatively highly doped silicon, e.g., highly doped p-type silicon. In other embodiments, active area connector 137 may be formed of any other material.

In some demonstrative embodiments, active area connector 137 may be separated by at least 0.3 um from active area 136. In other embodiments, active area connector 137 may be separated by any other distance from active area 136.

In some demonstrative embodiments, gettering region 135 or gettering region 145 may be formed on active area connector 137.

In some demonstrative embodiments, gettering region 135 may be formed on active area connector 137, and/or gettering region 145 may be formed on an active area connector 147 connecting between pixel 142 and another pixel, for example, an adjacent pixel to pixel 142, e.g., as described below with reference to FIG. 2.

In some demonstrative embodiments, the gettering region may be formed on the sources and/or the drains of one or more transistors of a pixel. For example, gettering region 135 may be formed on the sources and/or the drains of transistors 133, and/or gettering region 145 may be formed on the sources and/or the drains of transistors 143, e.g., as described below with reference to FIG. 3.

In other embodiments, the sources and/or the drains of transistors 133 and/or 143 may act as gettering regions for the metal contaminants. For example, the sources and/or the drains of transistors 133 may perform the functionality of gettering region 135, and/or the sources and/or the drains of transistors 143 may perform the functionality of gettering region 145.

In some demonstrative embodiments, wafer 120 may be heated to a temperature, which may enable trapping the metal contaminants in the gettering regions.

In some demonstrative embodiments, heating wafer 120 to a temperature of no more than 800 degrees Celsius may be enough to cause trapping of the metal contaminants in gettering regions 135 and/or 145.

In one example, the heating of wafer 120 to the temperature of no more than 800 degrees Celsius may be enough to cause the metal contaminants to diffuse on the active layer and to be trapped by gettering regions 135 and/or 145, e.g., outside of leakage-sensitive components 134 and/or 144. In other embodiments, wafer 120 may be heated to any other temperature.

In some demonstrative embodiments, creating a gettering region within each pixel of pixels 130 may enable a relatively fast diffusion of the metal contaminants into the gettering regions, for example, compared to the diffusion rate if the gettering areas are formed at a relatively large distance from the leakage-sensitive component.

In some demonstrative embodiments, creating a gettering region within each pixel of pixels 130 may enable a relatively more efficient and uniform gettering of the metal contaminants, for example, compared to the efficiency and the uniformity of gettering areas having trench separations between the gettering areas.

In some demonstrative embodiments, creating of the gettering region within each pixel of pixels 130 may enable using a relatively low temperature, e.g., even less than 800 degrees Celsius, to diffuse the metal contaminants to the gettering region, for example, compared to a temperature required to diffuse the metal contaminants, when the gettering areas are at a relatively large distance from the leakage-sensitive component.

Figure 2:
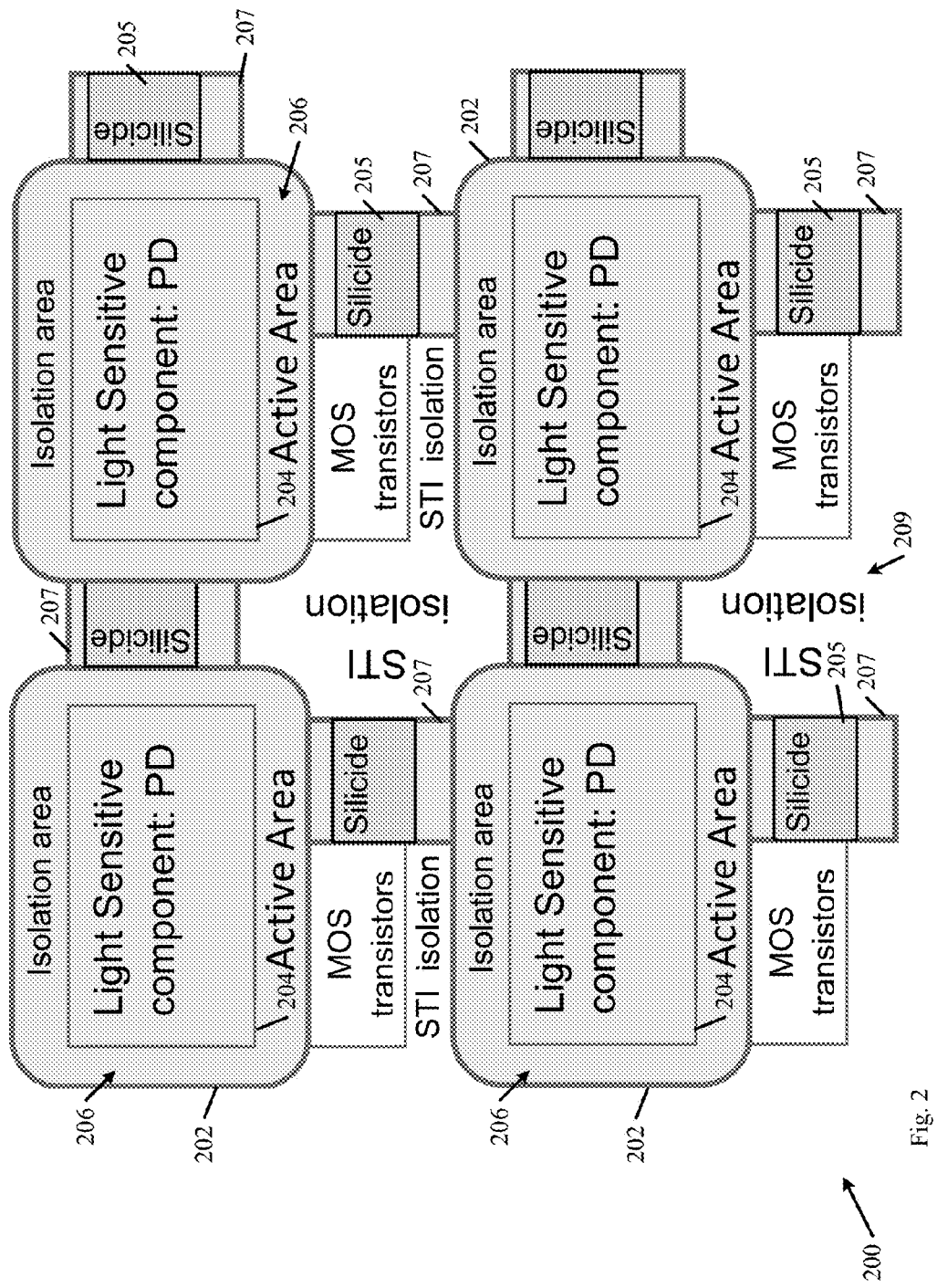
FIG. 2 is a schematic illustration of an array of complementary metal-oxide-semiconductor (CMOS) image sensor pixels, in accordance with some demonstrative embodiments.

Reference is made to FIG. 2, which schematically illustrates an array of CMOS image sensor pixels 200, in accordance with some demonstrative embodiments. For example, array 200 may include pixels 132 and/or 142 (FIG. 1).

As shown in FIG. 2, array 200 may include one or more pixels 202 including an active area 206.

As shown in FIG. 2, pixels 202 may include a non-silicide leakage-sensitive component 204, for example, a charge collecting component, e.g., a photo diode, or a storage area, e.g., a memory diode, formed on active area 206. For example, leakage-sensitive component 204 may perform the functionality of leakage-sensitive component 134 (FIG. 1).

As shown in FIG. 2, pixels 202 may include a non-leakage-sensitive area 208, for example, an isolation area, surrounding leakage-sensitive component 204.

As shown in FIG. 2, array 200 may include one or more active area connectors 207 to connect between two adjacent active areas 206.

As shown in FIG. 2, active area connectors 207 may form a continuous active area, for example, without an STI isolation 209, between two adjacent active areas 206.

As shown in FIG. 2, gettering regions 205, e.g., of a silicide material, may be formed on active area connectors 207.

In some demonstrative embodiments, gettering regions 205 may enable a uniform gettering of metal contaminants from leakage-sensitive component 204 into gettering regions 205. For example, metal contaminants of array 200 may migrate from leakage-sensitive components 204 into gettering regions 205 via active area connectors 207.

Figure 3:
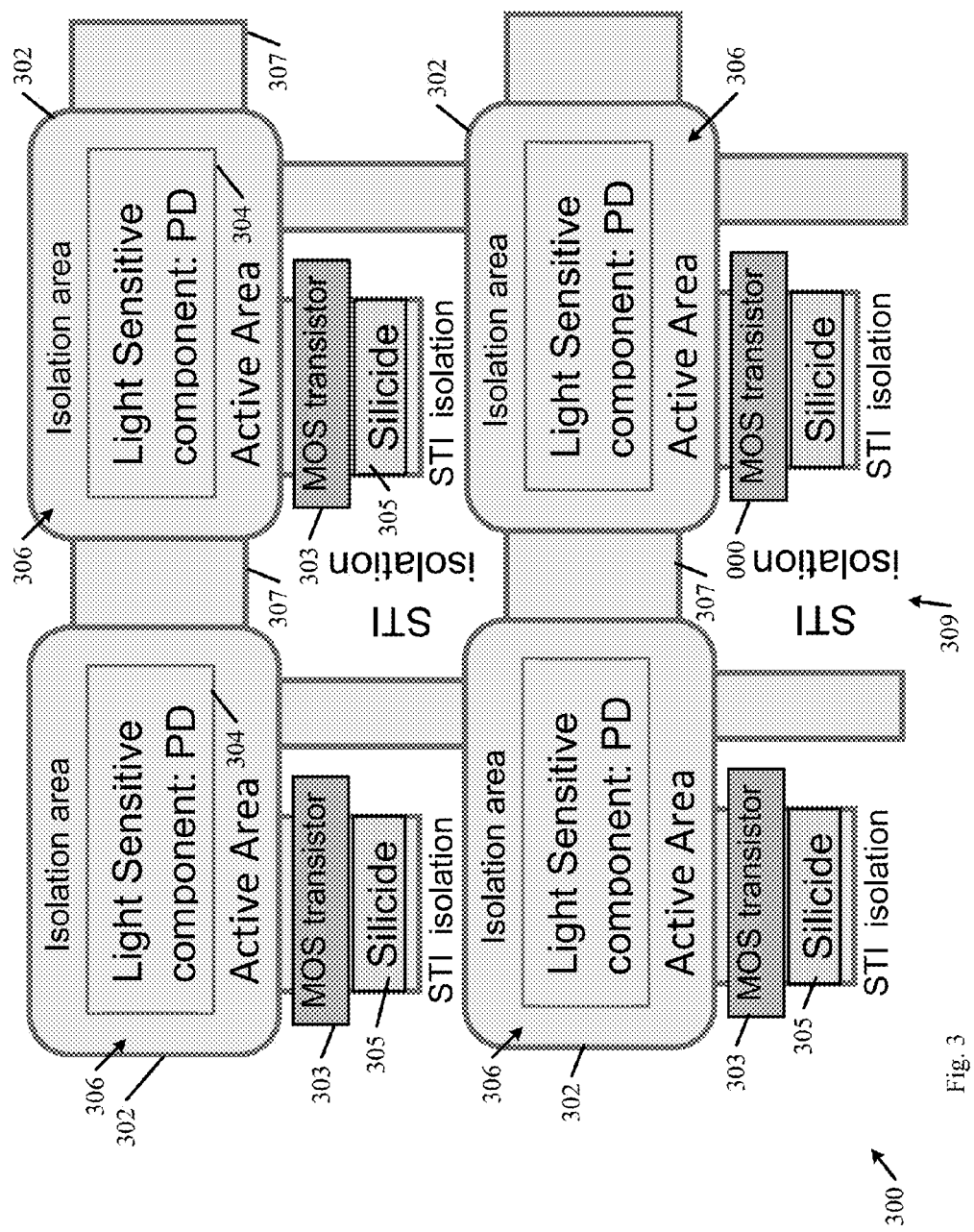
FIG. 3 is a schematic illustration of an array of CMOS image sensor pixels, in accordance with some demonstrative embodiments.

Reference is made to FIG. 3, which schematically illustrates an array of CMOS image sensor pixels 300, in accordance with some demonstrative embodiments. For example, array 300 may include pixels 132 and/or 142 (FIG. 1).

As shown in FIG. 3, array 300 may include one or more pixels 302 including an active area 306.

As shown in FIG. 3, pixels 302 may include a non-silicide leakage-sensitive component 304, for example, a charge collecting component, e.g., a photo diode, or a storage area, e.g., a memory diode, formed on active area 306. For example, leakage-sensitive component 304 may perform the functionality of leakage-sensitive component 134 (FIG. 1).

As shown in FIG. 3, pixels 302 may include a non-leakage-sensitive area 308, for example, an isolation area, surrounding leakage-sensitive component 304.

As shown in FIG. 3, pixels 302 may include one or more transistors 303. For example, transistors 303 may include one or more transistors, e.g., metal-oxide-semiconductor (MOS) transistors, to perform one or more electrical functionalities of IC 100 (FIG. 1).

As shown in FIG. 3, array 300 may include one or more active area connectors 307 to connect between two adjacent active areas 306.

As shown in FIG. 3, active area connectors 307 may form a continuous active area, for example, without an STI isolation 309, between two adjacent active areas 306.

As shown in FIG. 3, gettering regions 305, e.g., of a silicided material, may be formed on non-leakage-sensitive areas of transistors 303, e.g., sources and/or drains of the transistors.

As shown in FIG. 3, gettering regions 305 and the continuous active area may enable a uniform gettering of metal contaminants from leakage-sensitive component 304 into gettering regions 305. For example, metal contaminants of array 300 may migrate into gettering regions 305.

Figure 4:
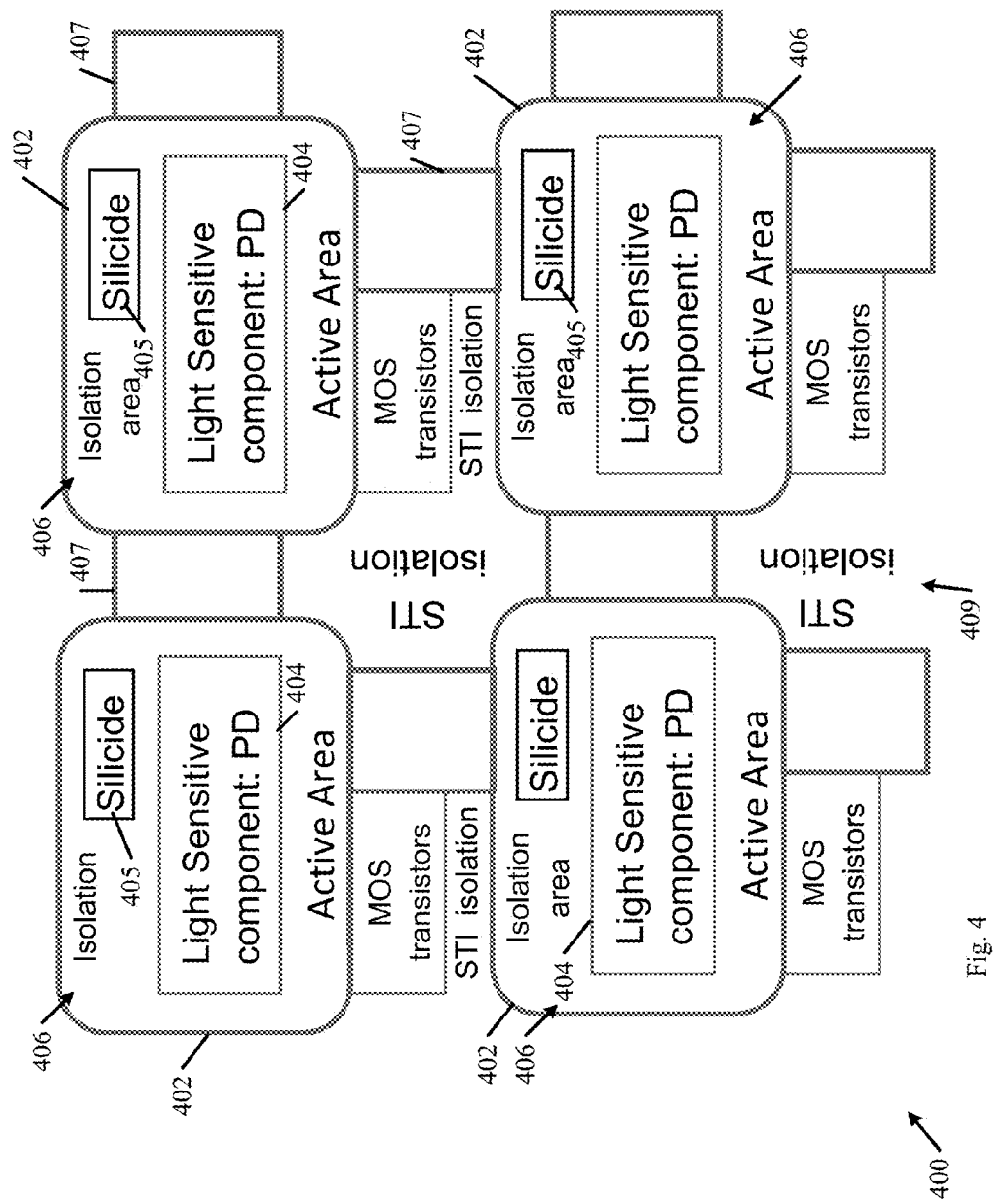
FIG. 4 is a schematic illustration of an array of CMOS image sensor pixels, in accordance with some demonstrative embodiments.

Reference is made to FIG. 4, which schematically illustrates an array of CMOS image sensor pixels 400, in accordance with some demonstrative embodiments. For example, array 400 may include pixels 132 and/or 142 (FIG. 1).

As shown in FIG. 4, array 400 may include one or more pixels 402 including an active area 406.

As shown in FIG. 4, pixels 402 may include a non-silicide leakage-sensitive component 404, for example, a charge collecting component, e.g., a photo diode, or a storage area, e.g., a memory diode, formed on active area 406. For example, leakage-sensitive component 404 may perform the functionality of leakage-sensitive component 144 (FIG. 1).

As shown in FIG. 4, pixels 402 may include a non-leakage-sensitive area 408, for example, an isolation area, surrounding leakage-sensitive component 404.

As shown in FIG. 4, array 400 may include one or more active area connectors 407 to connect between two adjacent active areas 406.

As shown in FIG. 4, active area connectors 407 may form a continuous active area, for example, without an STI isolation 409, between two adjacent active areas 406.

As shown in FIG. 4, gettering regions 405, e.g., of a silicide material, may be formed on non-leakage-sensitive areas 408.

As shown in FIG. 4, gettering regions 405 and the continuous active area may enable a uniform gettering of metal contaminants from leakage-sensitive component 404 into gettering regions 405. For example, metal contaminants of leakage-sensitive component 404 may migrate into gettering region 405 and metal contaminants of an adjacent leakage-sensitive component 404 may migrate into gettering regions 405 via active area connectors 407.

Figure 5:
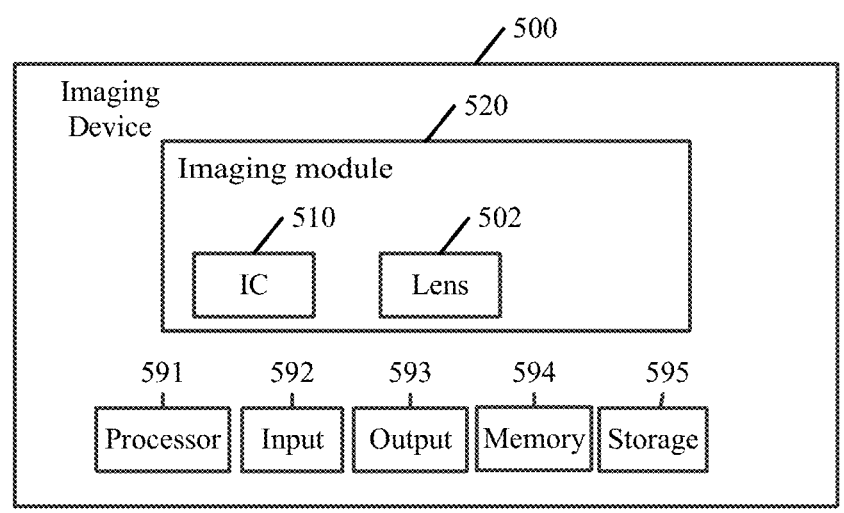
FIG. 5 is a schematic illustration of an image sensing device, in accordance with some demonstrative embodiments.

Reference is made to FIG. 5, which schematically illustrates an image sensing device 500 (also referred to as "imaging device"), in accordance with some demonstrative embodiments.

In some demonstrative embodiments, image sensing device 500 may include a digital camera, a video camera, a medical imaging device and the like.

In some demonstrative embodiments, image sensing device 500 may include a mobile device, e.g., a digital camera, a Smartphone, and the like. In other embodiments, imaging device 500 may include a non-mobile device, e.g., a medical imaging device and the like.

In some demonstrative embodiments, image sensing device 500 may include an imaging module 520 configured to process images and/or video.

In some demonstrative embodiments, imaging module 520 may include at least one lens 502.

In some demonstrative embodiments, imaging module 520 may include an IC 510 configured to sense an image received via lens 502 and to convert the image into an electric signal, for example to enable processing of the image. For example, IC 510 may perform the functionality of IC 100 (FIG. 1).

In some demonstrative embodiments, image sensing device 500 may also include, for example, a processor 591, an input unit 592, an output unit 593, a memory unit 594, and/or a storage unit 595. Imaging device 500 may optionally include other suitable hardware components and/or software components. In some demonstrative embodiments, some or all of the components of image sensing device 500 may be enclosed in a common housing or packaging, and may be interconnected or operably associated using one or more wired or wireless links. In other embodiments, components of image sensing device 500 may be distributed among multiple or separate devices.

Processor 591 includes, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. For example, processor 591 executes instructions, for example, of an Operating System (OS) of image sensing device 500 and/or of one or more suitable applications.

Memory unit 594 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 595 include, for example, a hard disk drive, a floppy disk drive, a Compact Disk (CD) drive, a CD-ROM drive, a DVD drive, or other suitable removable or non-removable storage units. For example, memory unit 594 and/or storage unit 595, for example, may store data processed by image sensing device 500.

Input unit 592 includes, for example, a keyboard, a keypad, a mouse, a touch-screen, a touch-pad, a track-ball, a stylus, a microphone, or other suitable pointing device or input device. Output unit 593 includes, for example, a monitor, a screen, a touch-screen, a flat panel display, a Cathode Ray Tube (CRT) display unit, a Liquid Crystal Display (LCD) display unit, a plasma display unit, one or more audio speakers or earphones, or other suitable output devices.

Figure 6:
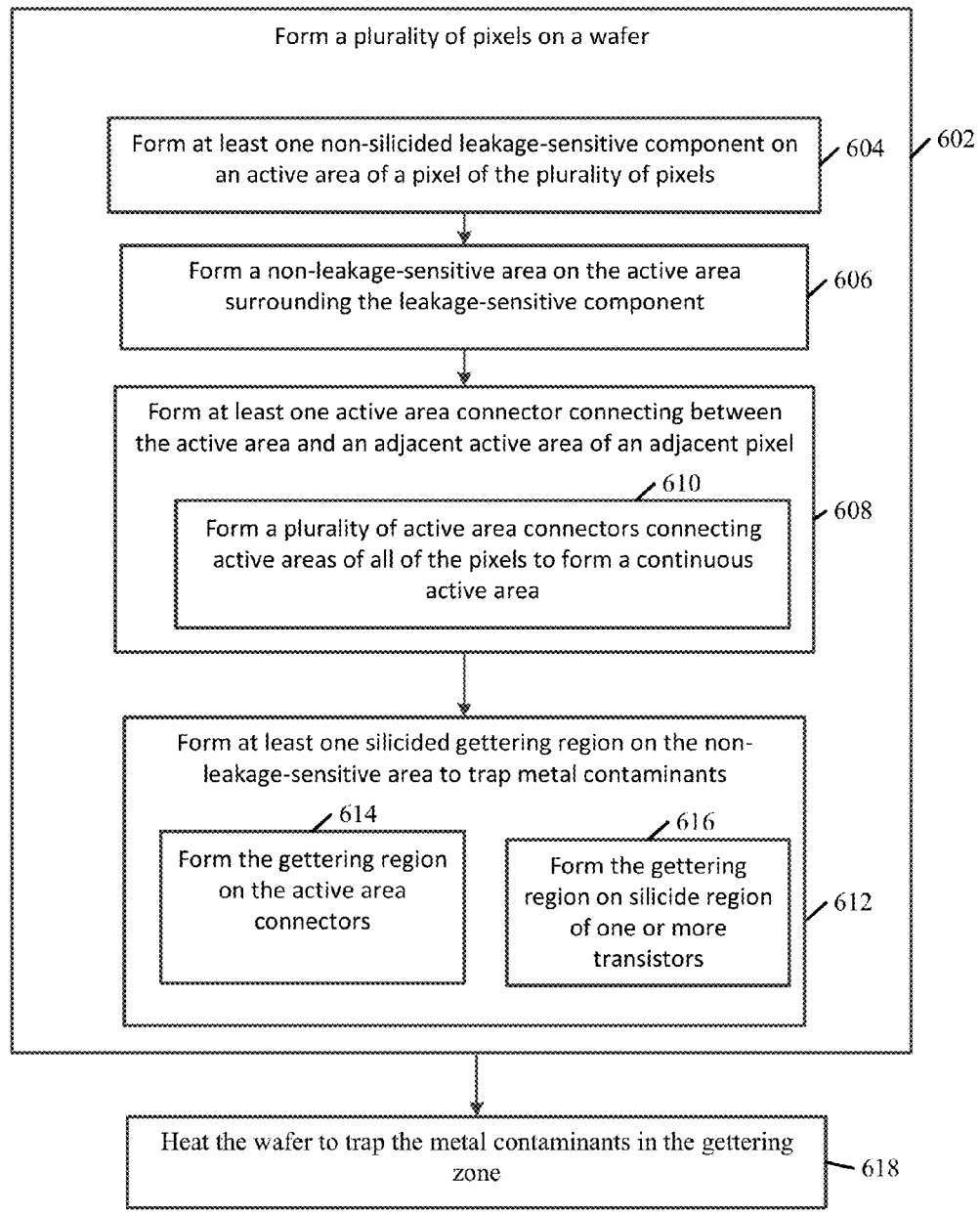
FIG. 6 is a schematic flow chart illustration of a method of gettering on a silicon on insulator (SOI) substrate, in accordance with some demonstrative embodiments.

Reference is made to FIG. 6, which schematically illustrates a flow chart of a method of gettering on SOI substrate, in accordance with some demonstrative embodiments. In some embodiments, one or more of the operations of the method of FIG. 6 may be performed during fabrication of an IC, e.g., IC 100 (FIG. 1).

As indicated at block 602, the method may include forming a plurality of pixels on a wafer. For example, pixels 130 (FIG. 1) may be formed on wafer 120 (FIG. 1), e.g., as described above.

As indicated at block 604, forming the plurality of pixels may include forming at least one non-silicided leakage-sensitive component on an active area of a pixel of the plurality of pixels. For example, non-silicided leakage-sensitive component 134 (FIG. 1) may be formed on active area 136 (FIG. 1) of pixel 132 (FIG. 1), e.g., as described above.

As indicated at block 606, forming the plurality of pixels may include forming a non-leakage-sensitive area on the active area surrounding the leakage-sensitive component. For example, non-leakage-sensitive area 138 (FIG. 1) may be formed on active area 136 (FIG. 1) surrounding leakage-sensitive component 134 (FIG. 1), e.g., as described above.

As indicated at block 608, forming the plurality of pixels may include forming at least one active area connector connecting between the active area and an adjacent active area of an adjacent pixel. For example, active area connector 137 (FIG. 1) may be formed to connect between active areas 138 and 148 (FIG. 1), e.g., as described above.

As indicated at block 610, forming the active area connector may include forming a plurality of active area connectors connecting active areas of all of the pixels to form a continuous active area. For example, the plurality of active area connectors 207 (FIG. 2) may be formed to form a continuous active area, e.g., as described above.

As indicated at block 612, forming the plurality of pixels may include forming at least one silicided gettering region on the non-leakage-sensitive area to trap metal contaminants. For example, gettering region 135 (FIG. 1) may be formed on non-leakage-sensitive area 138 (FIG. 1), e.g., as described above.

As indicated at block 614, forming the plurality of pixels may include forming the gettering region on the active area connectors. For example, gettering region 135 (FIG. 1) may be formed on active area connector 137 (FIG. 1), e.g., as described above.

As indicated at block 616, forming the plurality of pixels may include forming the gettering region on a silicide region of one or more transistors. For example, gettering region 135 (FIG. 1) may be formed on transistors 303 (FIG. 3), e.g., as described above.

As indicated at block 618, the method may include heating the wafer to trap the metal contaminants in the gettering region. For example, wafer 120 (FIG. 1) may be heated, e.g., a temperature of no more than 800 degrees Celsius, to trap the metal contaminants in gettering regions 135 and/or 145 (FIG. 1), e.g., as described above.

Examples

The following examples pertain to further embodiments.

Example 1 includes a complementary metal-oxide-semiconductor (CMOS) integrated circuit (IC) comprising a plurality of pixels arranged on a wafer, a pixel of the pixels including a silicon active area; at least one non-silicided leakage-sensitive component formed on the active area, the leakage-sensitive component is sensitive to metal contaminants; a non-leakage-sensitive area formed on the active area, the non-leakage-sensitive area surrounding the leakage-sensitive component; and at least one silicided gettering region formed on the non-leakage-sensitive area to trap the metal contaminants.

Example 2 includes the subject matter of example 1, and optionally, comprising at least one active area connector connecting between the active area and an adjacent active area of an adjacent pixel of the pixels to enable metal contaminants to migrate from the adjacent pixel to the gettering region.

Example 3 includes the subject matter of example 2, and optionally, comprising a plurality of active area connectors connecting active areas of all of the pixels to form a continuous active area.

Example 4 includes the subject matter of example 2 or 3, and optionally, wherein the gettering region is formed on the active area connector.

Example 5 includes the subject matter of any one of examples 1-4, and optionally, wherein a distance between the gettering region and the leakage-sensitive component is at least 0.3 micron.

Example 6 includes the subject matter of any one of examples 1-5, and optionally, wherein a distance between the gettering region and the leakage-sensitive component is no more than 100 micron.

Example 7 includes the subject matter of any one of examples 1-6, and optionally, wherein the non-leakage-sensitive area includes an isolation area to isolate the leakage-sensitive component.

Example 8 includes the subject matter of any one of examples 1-7, and optionally, wherein the gettering region includes a silicide region of one or more transistors in the non-leakage-sensitive area.

Example 9 includes the subject matter of any one of examples 1-8, and optionally, wherein the wafer comprises a silicon on insulator (SOI) wafer.

Example 10 includes the subject matter of any one of examples 1-9, and optionally, wherein the gettering region is formed of a material selected from the group consisting of Cobalt and Titanium.

Example 11 includes the subject matter of any one of examples 1-10, and optionally, wherein the gettering region has a thickness of at least 10 nanometer (nm) and no more than 100 nm.

Example 12 includes the subject matter of any one of examples 1-11, and optionally, wherein the CMOS IC comprises a Back-Side illuminated CMOS image sensor (BSI CIS).

Example 13 includes the subject matter of any one of examples 1-12, and optionally, wherein the leakage-sensitive component comprises a component selected from the group consisting of a photo diode and a memory node diode.

Example 14 includes a method of fabricating a complementary metal-oxide-semiconductor (CMOS) integrated circuit (IC) on a wafer, the method comprising forming a plurality of pixels on a wafer, the forming includes forming at least one non-silicided leakage-sensitive component on an active area of a pixel of the plurality of pixels, the leakage-sensitive component is sensitive to metal contaminants; forming a non-leakage-sensitive area on the active area, the non-leakage-sensitive area surrounding the leakage-sensitive component; and forming at least one silicided gettering region on the non-leakage-sensitive area to trap the metal contaminants.

Example 15 includes the subject matter of example 14, and optionally, comprising forming at least one active area connector connecting between the active area and an adjacent active area of an adjacent pixel of the pixels to enable metal contaminants to migrate from the adjacent pixel to the gettering region.

Example 16 includes the subject matter of example 15, and optionally, comprising forming the gettering region on the active area connector.

Example 17 includes the subject matter of example 15 or 16, and optionally, comprising forming a plurality of active area connectors connecting active areas of all of the pixels to form a continuous active area.

Example 18 includes the subject matter of any one of examples 14-17, and optionally, comprising heating the wafer to a temperature of no more than 800 degrees Celsius to trap the metal contaminants in the gettering region.

Example 19 includes an image sensing device comprising at least one lens; and at least one complementary metal-oxide-semiconductor (CMOS) integrated circuit (IC) comprising a plurality of pixels arranged on a wafer, a pixel of the pixels including a silicon active area; at least one non-silicided leakage-sensitive component formed on the active area, the leakage-sensitive component is sensitive to metal contaminants; a non-leakage-sensitive area formed on the active area, the non-leakage-sensitive area surrounding the leakage-sensitive component; and at least one silicided gettering region formed on the non-leakage-sensitive area to trap the metal contaminants.

Example 20 includes the subject matter of example 19, and optionally, wherein the pixel comprises at least one active area connector connecting between the active area and an adjacent active area of an adjacent pixel of the pixels to enable metal contaminants to migrate from the adjacent pixel to the gettering region.

Example 21 includes the subject matter of example 20, and optionally, wherein the gettering region is formed on the active area connector.

Example 22 includes the subject matter of any one of examples 19-21, and optionally, wherein the pixel comprises a plurality of active area connectors connecting active areas of all of the pixels to form a continuous active area.

Example 23 includes the subject matter of any one of examples 19-22, and optionally, wherein the gettering region is formed on the active area connector.

Example 24 includes the subject matter of any one of examples 19-23, and optionally, wherein a distance between the gettering region and the leakage-sensitive component is at least 0.3 micron.

Example 25 includes the subject matter of any one of examples 19-24, and optionally, wherein a distance between the gettering region and the leakage-sensitive component is no more than 100 micron.

Example 26 includes the subject matter of any one of examples 19-25, and optionally, wherein the non-leakage-sensitive area includes an isolation area to isolate the leakage-sensitive component.

Example 27 includes the subject matter of any one of examples 19-26, and optionally, wherein the gettering region includes a silicide region of one or more transistors in the non-leakage-sensitive area.

Example 28 includes the subject matter of any one of examples 19-27, and optionally, wherein the wafer comprises a silicon on insulator (SOI) wafer.

Example 29 includes the subject matter of any one of examples 19-28, and optionally, wherein the gettering region is formed of a material selected from the group consisting of Cobalt and Titanium.

Example 30 includes the subject matter of any one of examples 19-29, and optionally, wherein the gettering region has a thickness of at least 10 nanometer (nm) and no more than 100 nm.

Example 31 includes the subject matter of any one of examples 19-30, and optionally, wherein the CMOS IC comprises a Back-Side illuminated CMOS image sensor (BSI CIS).

Example 32 includes the subject matter of any one of examples 19-31, and optionally, wherein the leakage-sensitive component comprises a component selected from the group consisting of a photo diode and a memory node diode.

Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. A complementary metal-oxide-semiconductor (CMOS) integrated circuit (IC) comprising:
   a plurality of pixels arranged on a wafer, a pixel of said pixels including:
      a silicon active area;
      at least one non-silicided leakage-sensitive component formed on said active area, said leakage-sensitive component is sensitive to metal contaminants;
      a non-leakage-sensitive area formed on said active area, said non-leakage-sensitive area surrounding said leakage-sensitive component; and
      at least one silicided gettering region formed on said non-leakage-sensitive area to trap said metal contaminants; and
   a plurality of active area connectors connecting active areas of said plurality of pixels to form a continuous active area, said plurality of active area connectors comprising at least one active area connector connecting between the active area of said pixel and an adjacent active area of an adjacent pixel of said pixels to enable said metal contaminants to migrate from said adjacent pixel to said gettering region.

2. The CMOS IC of claim 1, wherein said gettering region is formed on said active area connector.

3. The CMOS IC of claim 1, wherein a distance between said gettering region and said leakage-sensitive component is at least 0.3 micron.

4. The CMOS IC of claim 1, wherein a distance between said gettering region and said leakage-sensitive component is no more than 100 micron.

5. The CMOS IC of claim 1, wherein said non-leakage-sensitive area includes an isolation area to isolate said leakage-sensitive component.

6. The CMOS IC of claim 1, wherein said gettering region includes a silicide region of one or more transistors in said non-leakage-sensitive area.

7. The CMOS IC of claim 1, wherein said wafer comprises a silicon on insulator (SOI) wafer.

8. The CMOS IC of claim 1, wherein said gettering region is formed of a material selected from the group consisting of Cobalt and Titanium.

9. The CMOS IC of claim 1, wherein said gettering region has a thickness of at least 10 nanometer (nm) and no more than 100 nm.

10. The CMOS IC of claim 1, wherein said CMOS IC comprises a Back-Side illuminated CMOS image sensor (BSI CIS).

11. The CMOS IC of claim 1, wherein said leakage-sensitive component comprises a component selected from the group consisting of a photo diode and a memory node diode.

12. An image sensing device comprising:
    at least one lens; and
    at least one complementary metal-oxide-semiconductor (CMOS) integrated circuit (IC) comprising:
       a plurality of pixels arranged on a wafer, a pixel of said pixels including:
          a silicon active area;
          at least one non-silicided leakage-sensitive component formed on said active area, said leakage-sensitive component is sensitive to metal contaminants;
          a non-leakage-sensitive area formed on said active area, said non-leakage-sensitive area surrounding said leakage-sensitive component; and
          at least one silicided gettering region formed on said non-leakage-sensitive area to trap said metal contaminants; and
       a plurality of active area connectors connecting active areas of said plurality of pixels to form a continuous active area, said plurality of active area connectors comprising at least one active area connector connecting between the active area of said pixel and an adjacent active area of an adjacent pixel of said pixels to enable said metal contaminants to migrate from said adjacent pixel to said gettering region.

13. The image sensing device of claim 12, wherein said non-leakage-sensitive area includes an isolation area to isolate said leakage-sensitive component.

14. The image sensing device of claim 12, wherein said gettering region is formed on said active area connector.

* * * * *